United States Patent
Kamata et al.

[11] Patent Number: 5,489,873
[45] Date of Patent: Feb. 6, 1996

[54] ACTIVE LOW-PASS FILTER

[75] Inventors: Takatsugu Kamata; Jun Takahashi, both of Yokohama, Japan

[73] Assignee: Motorola, Inc., Schaumburg, Ill.

[21] Appl. No.: 395,136

[22] Filed: Feb. 27, 1995

[30] Foreign Application Priority Data

Mar. 3, 1994 [JP] Japan .................... 6-033875

[51] Int. Cl.[6] ................................. H03H 11/12
[52] U.S. Cl. .................. 327/558; 330/107; 330/294
[58] Field of Search ..................... 327/558, 560, 327/561, 254, 255; 330/107, 109, 294, 303

[56] References Cited

U.S. PATENT DOCUMENTS

| | | | |
|---|---|---|---|
| 3,792,367 | 2/1974 | Fleischer et al. | 330/98 |
| 4,011,466 | 3/1977 | Pearlman et al. | 330/107 |
| 4,275,453 | 6/1981 | Wagner | 327/558 |
| 5,293,086 | 3/1994 | Tanigawa et al. | 330/107 |
| 5,396,188 | 3/1995 | Aoki | 330/107 |

FOREIGN PATENT DOCUMENTS

| | | | |
|---|---|---|---|
| 2-971110 | 4/1990 | Japan | 327/558 |
| 4-294627 | 10/1992 | Japan | 327/558 |

*Primary Examiner*—Terry Cunningham
*Attorney, Agent, or Firm*—Rennie William Dover; Harry A. Wolin

[57] ABSTRACT

An active low-pass filter suitable as a 90° phase shifter circuit is provided which requires few external components when formed as an IC. The current resulting from the input signal outputted from a first impedance element is amplified by a first current amplifier, and the resulting output current is converted by a first converting means to a voltage, which is supplied via a second impedance element to a second current amplifier; the output current of the second current amplifier is converted by a second converting means to a voltage, which is outputted as a filter output, while the current corresponding to the output voltage of the second converting means is negatively fed back into the inputs of the first and second current amplifiers; furthermore, at least the current amplification factor of the first current amplifier is made controllable, thereby permitting the cut-off frequency to be varied arbitrarily.

4 Claims, 4 Drawing Sheets

ACTIVE LOW-PASS FILTER

TECHNICAL FIELD

The present invention relates to an active low-pass filter suitable as a 90° phase shifter circuit.

BACKGROUND

A 90° phase shifter circuit is used in, for example, a quadrature FM demodulator circuit to generate a signal 90° different in phase from an input intermediate frequency (IF) signal. The 90° phase shifter circuit of the FM demodulator circuit is formed of a BPF (band-pass filter) using LCR (coil, capacitor and resistor) as shown in FIG. 1, or a bi-quad LPF (low-pass filter) using an op-amp as shown in FIG. 2. With the BPF using the LCR, to vary the center frequency so as to provide a 90° phase difference, the coil is adjusted, or a varicap diode is used to vary it to a capacitance value corresponding to its terminal voltage. With the by-quad LPF, a cut-off frequency or value of Q may be obtained by varying the constants of external elements connected to the op-amp.

However, even when either the BPF or bi-quad LPF is used as a 90° phase shifter circuit, there is a problem that external components such as coils, capacitors, and resistors are required to form it as an IC (integrated circuit), so that its size and weight cannot be reduced, or the need for adjustment cannot be eliminated.

Accordingly, it is an object of the present invention to provide an active low-pass filter that is suitable as a 90° phase shifter circuit, which requires few external components when formed as an IC.

SUMMARY OF THE INVENTION

An active low-pass filter according to the present invention comprises: a first impedance element for accepting an input signal; a first current amplifier for amplifying the current outputted from the first impedance means; a first converting means for converting the output current of the first current amplifier to a voltage to output it via a second impedance means; a second current amplifier for amplifying the current derived through the output voltage of the first converting means; a second converting means for converting the output current of the second current amplifier to a voltage to output it as a filter output; a negative feedback means for negatively feeding back the current corresponding to the output voltage of the second converting means into the inputs of the first and second current amplifiers; and a control means for varying the current amplification factor of the first current amplifier.

With the active low-pass filter of the present invention, at least the current amplification factor of the first current amplifier is varied to arbitrarily change the cut-off frequency.

DETAILED DESCRIPTION OF THE PREFERRED EMBODIMENT

Now, an embodiment of the present invention will be described in detail hereinbelow with reference to the drawings.

Figure 1:
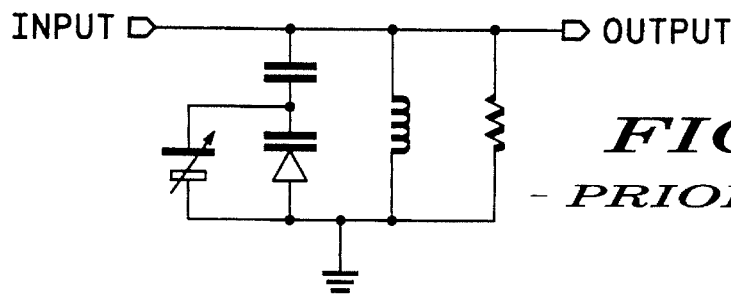
FIG. 1 is a circuit diagram depicting a band-pass filter conventionally used as a 90° phase shifter circuit.
Figure 2:
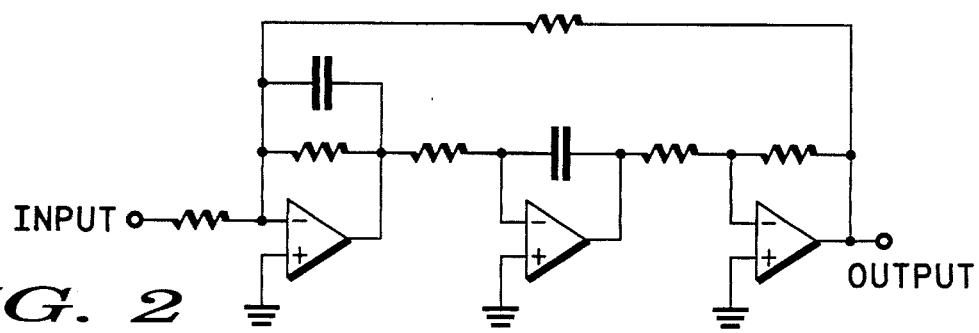
FIG. 2 is a circuit diagram depicting a low-pass filter conventionally used as a 90° phase shifter circuit.
Figure 3:
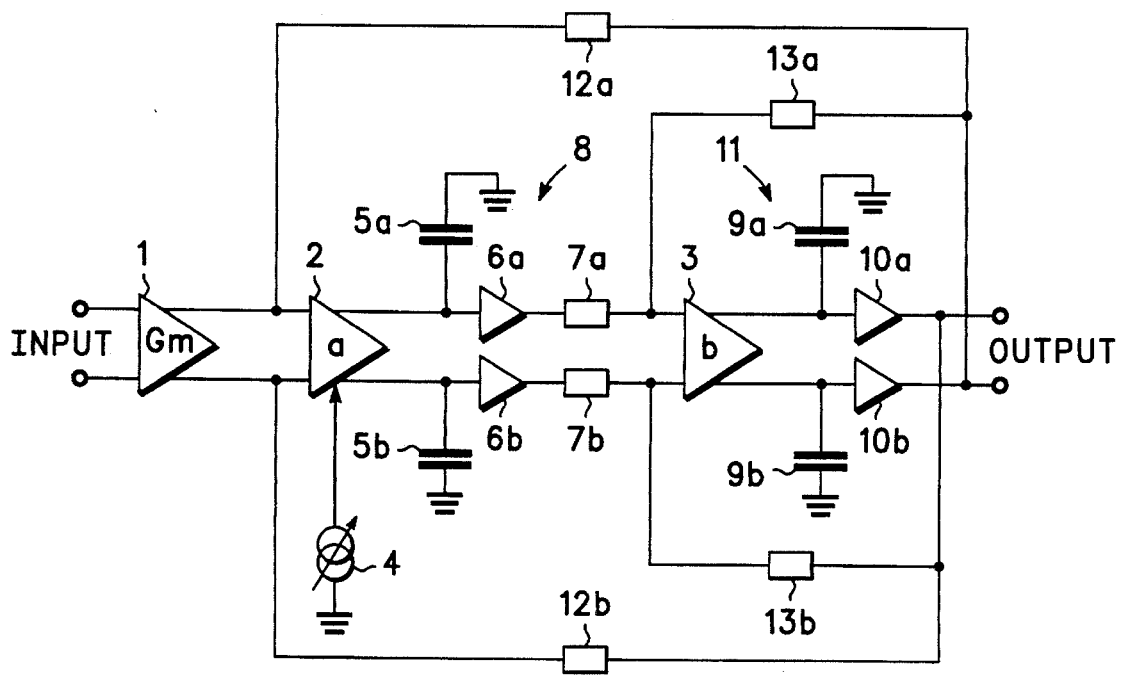
FIG. 3 is a circuit diagram depicting an embodiment of the present invention.

FIG. 3 depicts a by-quad active low-pass filter according to the present invention. With this active low-pass filter, three current amplifiers 1, 2 and 3 are provided. Each of these current amplifiers 1, 2, and 3 is comprised of a differential amplifier. The current amplifier 1, which corresponds to a first impedance element, provides a constant current amplification on a input signal to supply its output signal to the current amplifier 2. To the current amplifier 2 is connected an amplification factor control circuit 4 having a variable current source, wherein the current amplification factor of the current amplifier 2 is varied according to the output current of the amplification factor control circuit 4. To the differential output of the current amplifier 2 is connected a voltage converting circuit 8, which is comprised of capacitors 5a and 5b, buffers 6a and 6b, and resistors 7a and 7b. The resistors 7a and 7b correspond to a second impedance element. The output of the voltage converting circuit 8 is connected to the current amplifier 3. That is, the voltage on the capacitors 5a and 5b derived by drawing the output current from the current amplifier 2 into the capacitors 5a and 5b is supplied to the current amplifier 3 via the buffers 6a and 6b and resistors 7a and 7b. The current amplifier 3 amplifies by a constant amplification factor the current drawn due to the output voltage of the voltage converting circuit 8.

To the differential output of the current amplifier 3 is connected a voltage converting circuit 11 which is comprised of capacitors 9a and 9b and buffers 10a and 10b. The output signal of the voltage converting circuit 11 is supplied to the output terminal. That is, the voltage on the capacitors 9a and 9b derived by drawing the output current from the current amplifier 3 to the capacitors 9a and 9b is outputted via the buffers 10a and 10b. Resistors 12a, 12b, 13a and 13b are provided in order to negatively feed back the output of the voltage converting circuit 11 into the inputs of the current amplifiers 2 and 3. The output voltage of the buffer 10 is supplied to one input terminal of the current amplifier 2 via the resistor 12a, and also supplied to one input terminal of the current amplifier 3 via the resistor 13a. Similarly, the output voltage of the buffer 10a is supplied to the other input terminal of the current amplifier 2 via the resistor 12b, and also supplied to the other input terminal of the current amplifier 3 via the resistor 13b.

With the above configuration, the current corresponding to the differential input voltage supplied to the input terminal is amplified by the current amplifier 1, and the resulting amplified current is drawn into the current amplifier 2. Also, the current corresponding to each output voltage of the buffers 10a and 10b is drawn into the current amplifier 2 via the feedback resistors 12b and 12a. The current amplifier 2 amplifies the resulting current, with the amplification factor of the current amplifier 2 varying according to the current supplied from the amplification factor control circuit 4 as described above. The output current of the current amplifier 2 is converted by the voltage converting circuit 8 to a voltage, which is supplied to the current amplifier 3. The current corresponding to each output voltage of the buffers 10a and 10b, along with the current corresponding to the output voltage of the voltage converting circuit 8, is drawn into the current amplifier 3 via the feedback resistors 13b and 13a. The current amplifier 3 amplifies the resulting current, and the output current of the current amplifier 3 is outputted as a voltage via the voltage converting circuit 11.

Figure 4:
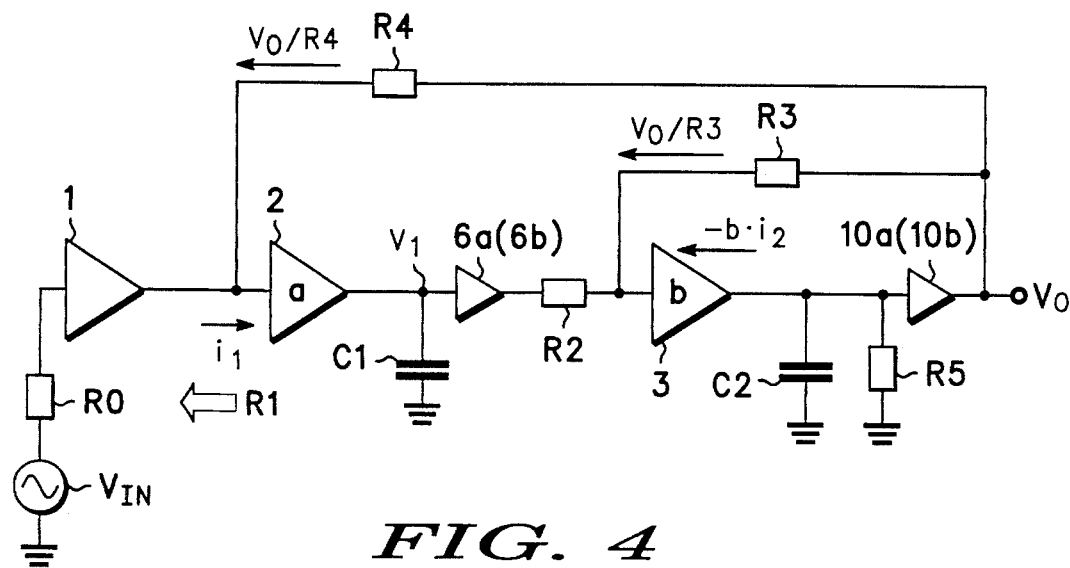
FIG. 4 is a circuit diagram for explaining that it has input/output characteristics as a low-pass filter.

Next, it is explained that such an active low-pass filter has input/output characteristics as a low-pass filter. FIG. 4 depicts the arrangement of FIG. 3 in a more simple form, where reference symbols $R_0$–$R_5$ denote resistance values, and symbols $C_1$ and $C_2$ denote capacitance values of the capacitors, and symbols a and b denote the amplification factors of the current amplifiers 2 and 3. Reference symbols $V_{in}$, $V_1$, and $V_3$, and $V_0$ denote the input voltage of the low-pass filter, the output voltage of the current amplifier 2, the output voltage of the current amplifier 3, and the output voltage of the low-pass filter, respectively. Furthermore, reference symbols $i_1$ and $i_2$ denote the input currents of the current amplifiers 2 and 3, respectively. Reference symbol $R_1$ denotes a resistance value (impedance) on the current amplifier 1 seen from the input of the current amplifier 2.

Now, assuming that the complex variable is represented by s, then the output voltages $V_1$ of the current amplifier and $V_0$ are given by:

$$V_1 = \frac{1}{SC_1} \, ai_1 = \frac{a}{SC_1} \left( \frac{V_0}{R_4} + \frac{V_{in}}{R_1} \right) \quad (1)$$

$$V_0 = V_3 = \frac{R_5}{1+SC_2R_5} \, b(-i_2) = \frac{R_5}{1+SC_2R_5} \, b \left( \frac{V_1}{R_2} + \frac{V_0}{R_3} \right) \quad (2)$$

Substituting the voltage $V_1$ of Eq. (1) into Eq. (2) yields:

$$V_0 = -\frac{bR_5}{1+SC_2R_5} \left\{ \frac{1}{R_2} \, \frac{a}{SC_1} \left( \frac{V_0}{R_4} + \frac{V_{in}}{R_1} \right) + \frac{V_0}{R_3} \right\} \quad (3)$$

$$= -\frac{bR_5}{1+SC_2R_5} \left\{ V_0 \left( \frac{a}{SC_1R_2R_4} + \frac{1}{R_3} \right) + \frac{a}{SC_1R_2R_1} V_{in} \right\}$$

$$V_0 \left\{ \frac{bR_5}{1+SC_2R_5} \left( \frac{a}{SC_1R_2R_4} + \frac{1}{R_3} \right) + 1 \right\} = \quad (4)$$

$$-\frac{bR_5}{1+SC_2R_5} \cdot \frac{a}{SC_1R_2R_1} V_{in}$$

Thus, the input/output voltage ratio, $V_0/V_{in}$, is as follows, where $P_1 = C_1R_4$, $P_2 = C_2R_3$, $K_3 = R_3/R_2$, $K_4 = R_4/R_1$, and $M = R_3/R_5$:

$$\frac{V_0}{V_{in}} = \frac{-\frac{bR_5}{1+SC_2R_5} \cdot \frac{a}{SC_1R_1R_2}}{\frac{bR_5}{1+SC_2R_5} \left( \frac{a}{SC_1R_2R_4} + \frac{1}{R_3} + \frac{1+SC_2R_5}{bR_5} \right)} \quad (5)$$

$$= \frac{-a}{\frac{aR_1}{R_4} + \frac{SC_1R_1R_2}{R_3} + \frac{SC_1R_1R_2}{bR_5} + \frac{S^2C_1C_2R_1R_2}{b}}$$

$$= \frac{\frac{-ab}{C_1C_2R_1R_2}}{S^2 + \left( \frac{1}{R_3} + \frac{1}{bR_5} \right) \frac{b}{C_2} S + \frac{ab}{C_1C_2R_2R_4}}$$

$$= \frac{-\frac{K_3K_4}{P_1P_2} \, ab}{S^2 + \frac{b+M}{P_2} S + \frac{K_3}{P_1P_2} \, ab}$$

$$= \frac{-K_3K_4}{P_1P_2} \, ab \, \frac{1}{S^2 + \frac{b+M}{P_2} S + \frac{K_3}{P_1P_2} \, ab}$$

From Eq. (5), it is obvious that the filter has a characteristic as a low-pass filter. For angular frequency $W_0$ at a cut-off frequency $f_0$, relationships as shown in Eqs. (6) and (7) are obtained from Eq. (5):

$$\omega_0^2 = \frac{K_3}{P_1P_2} \, ab \quad (6)$$

$$\omega_0 = \sqrt{\frac{K_3}{P_1P_2} \, ab} \quad (7)$$

Now, by setting $C_1=C_2=C$, $R_4=R$, and $R_2=R_3=nR$, then $K_3=1$, $P_1=CR$, and $P_2=nCR$, so that the cut-off frequency $f_0$ is given by Eq. (8), where n is an integer, and a=5, b=⅕, and n=4, for example.

$$f_0 = \frac{1}{2\pi CR} \sqrt{\frac{ab}{n}} \quad (8)$$

Thus, by varying the current amplification factor a of the current amplifier 2 with the amplification factor control circuit 4, the cut-off frequency $f_0$ is varied.

From Eq. (5), a relationship between the angular frequency $W_0$ and Q is approximately given by:

$$\frac{\omega_0}{Q} \, \omega_0 = \frac{b+M}{P_2} \quad (9)$$

So, assuming that $R_5 \to \infty$ and $M \to 0$, then Q is represented as follows from Eq. (8):

$$Q = \frac{P_2}{b+M} \, \omega_0 \quad (10)$$

$$= \frac{nCR}{b} \cdot \frac{1}{CR} \sqrt{\frac{ab}{n}}$$

$$= \frac{1}{b} \sqrt{nab}$$

Accordingly, it is found that Q varies with the current amplification factors a and b.

Figure 5:
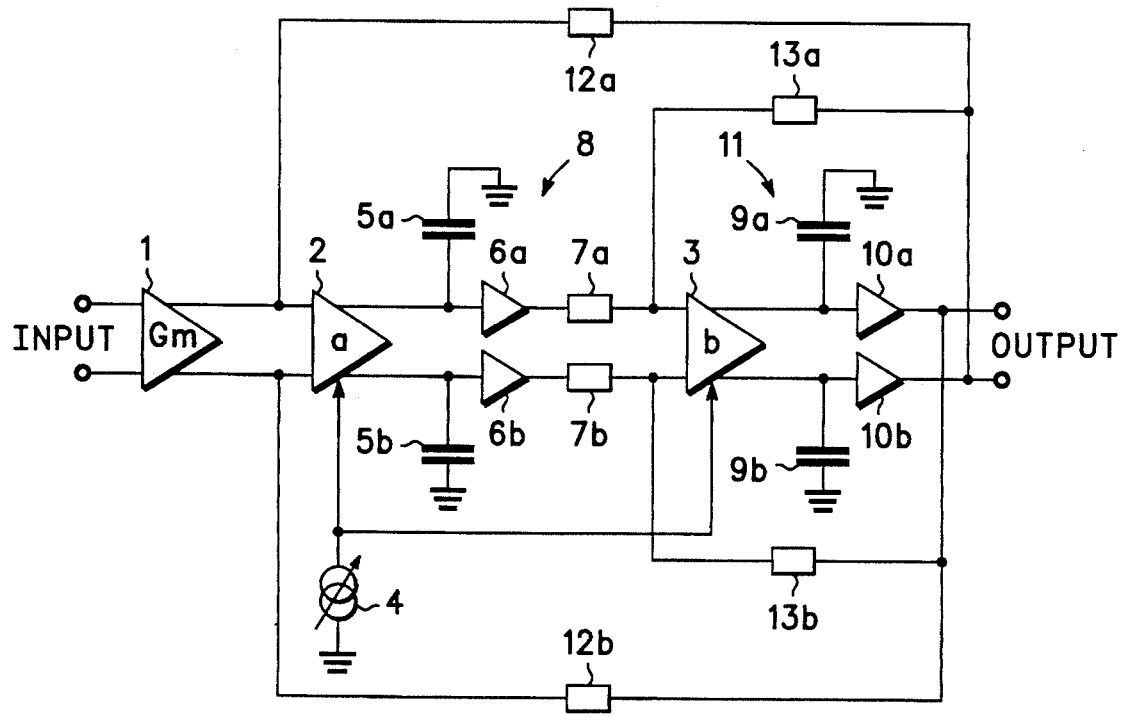
FIG. 5 is a circuit diagram depicting another embodiment of the present invention.

FIG. 5 shows another embodiment of the present invention, where similar parts of FIG. 3 are denoted by the same reference symbols. With this active low-pass filter, not only the current amplification factor of the current amplifier 2 varies according to the current of the amplification factor control circuit 4, but also the current amplification factor of the current amplifier 3 also varies according thereto.

Figure 6:
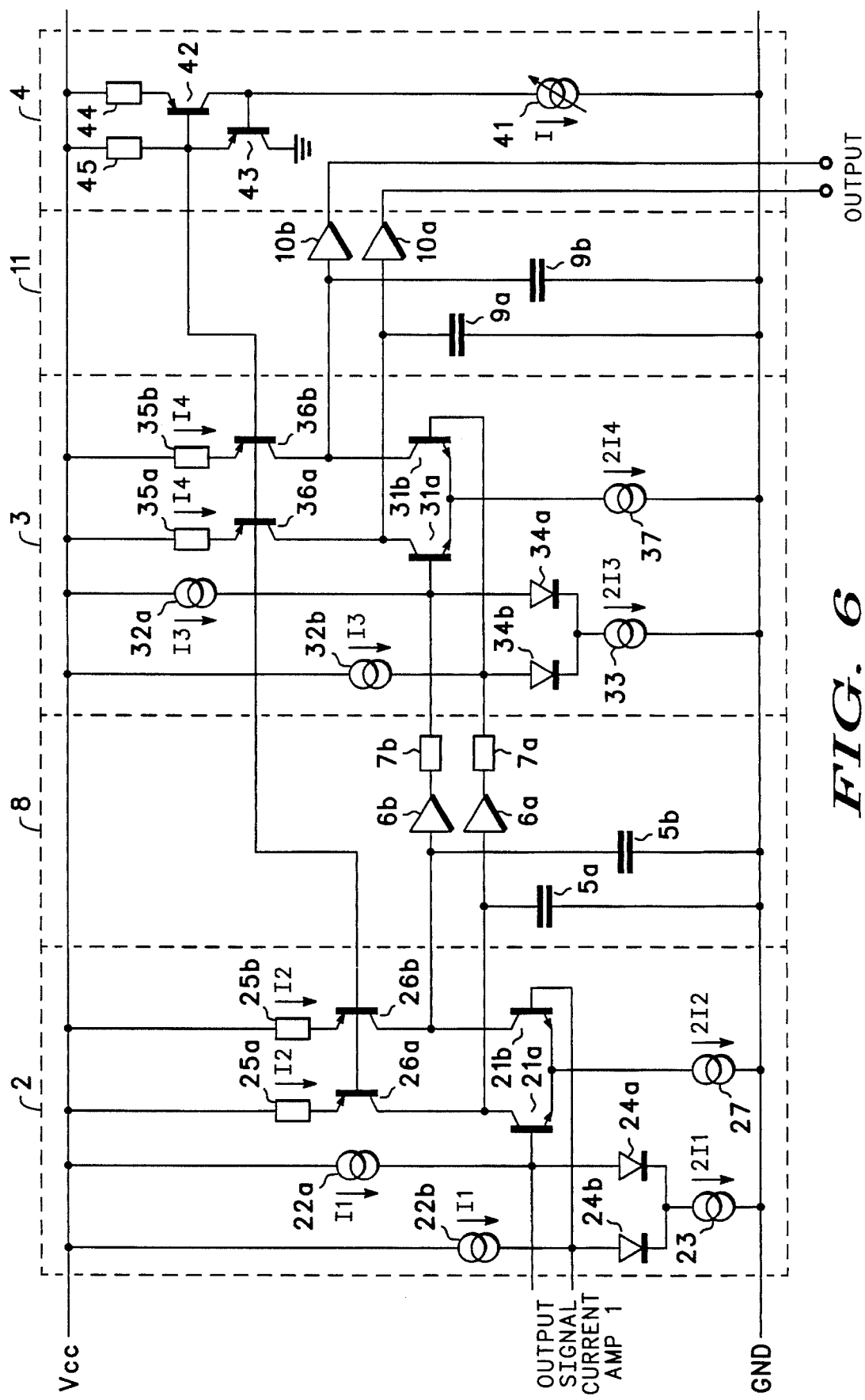
FIG. 6 is a circuit diagram depicting specifically an arrangement of principal portions of the filter of FIG. 5.

FIG. 6 shows in specific form principal portions of FIG. 5. The current amplifier 2 has transistors 21a and 21b connected in a differential manner, with the bases of the transistors 21a and 21b forming its input terminal. On their bases, a current source circuit is formed which is comprised of constant current sources 22a, 22b and 23 and diodes 24a and 24b. The constant current sources 22a and 22b generate a current $I_1$, while the constant current source 23 generates a current $2I_1$. At a node between the constant current source 22a and the anode of the diode 24a is connected the base of the transistor 22a, while at a node between the constant current source 22b and the anode of the diode 24 b is connected the base of the transistor 22b. The current flowing through the diodes 24a and 24b flows through the constant current source 23. The current source comprised of resistors 25a and 25b and transistors 26a and 26b is connected to the collectors of the transistors 21a and 22b that form an output terminal of the current amplifier 2. This current source is formed as a current receptor for a current mirror of the amplification factor control circuit 4 to generate a current $I_2$. To the emitters of the transistors 21a and 21b are commonly connected a current source 27 which generates a current $2I_2$.

The current amplifier 3 is comprised of transistors 31a, 31b, 36a, and 36b, constant current sources 32a, 32b, 33, and 37, diodes 34a and 34b, and resistors 35a and 35b, and arranged similarly to the current amplifier 2. The constant current sources 32a and 32b generate a current $I_3$, while the constant current source 33 generates $2I_3$. Furthermore, the constant current source 37 generates $2I_4$.

The amplification factor control circuit 4 is comprised of a variable current source 41, transistors 42 and 43 and resistors 44 and 45, wherein the transistors 42 and 43 and resistors 44 and 45 form a current output portion of the current mirror that draws a current corresponding to the current outputted from the variable current source 41 into the transistors 26a, 26b, 36a, and 36b.

Thus, the values of currents $I_2$ and $I_4$ are determined according to the output current value of the variable current source 41, the ratios of constant currents $I_1$ and $I_3$ to currents $I_2$ and $I_4$, i.e., the current amplification factors a and b, are given by:

$$a = \frac{I_2}{I_1}, b = \frac{I_4}{I_3} \quad (11)$$

So, they vary with variations in the output current value of the variable current source 41.

As in the embodiment of FIG. 5, since the cut-off frequency $f_0$ is expressed by Eq. (8) above, both the amplification factors a and b vary as the output current I of the variable current source 41 changes, so that the cut-off frequency $f_0$ varies. Substituting Eq. (8) into Eq. (11) yields:

$$f_0 = \frac{1}{2\pi CR \sqrt{n}} \sqrt{\frac{1}{I_1 I_3}} \sqrt{I_2 I_4} \quad (12)$$

$$= K \sqrt{I_2 I_4}$$

$$\text{where } \frac{1}{2\pi CR \sqrt{n}} \sqrt{\frac{1}{I_1 I_3}} = K$$

Now, assuming that $I_2 = m_1 I$, $I_4 = m_2 I$ (where $m_1$ and $m_2$ are current ratios), then the cut-off frequency $f_0$ may be represented as follows:

$$f_0 = K \sqrt{m_1 m_2} \cdot I \quad (13)$$

Thus, the cut-off frequency $f_0$ is proportional to the output current I of the variable current source 41. Furthermore, $df_0/dI$, obtained by differentiating Eq. (13), is given by:

$$\frac{df_0}{dI} = K \sqrt{m_1 m_2} = \frac{f_0}{I} \quad (14)$$

Thus, because its slope is constant, the cut-off frequency $f_0$ varies linearly with respect to the current I.

On the other hand, Q is represented by Eq. (10) above; assuming now that the cut-off frequency $f_0$ is equal to $f_0'$ due to changes in both the amplification factors a and b, then the changed current amplification factors a' and b' are a'= ka and b'=kb, where k≠0. Then, because Q' is given by:

$$Q' = \frac{1}{b'} \sqrt{na'b'} \quad (15)$$

$$= \frac{1}{Kb} \sqrt{n \cdot Ka \cdot Kb}$$

$$= \frac{1}{b} \sqrt{nab}$$

$$= Q$$

it is found that the value of Q remains unchanged even when the current amplification factors a and b vary.

Next, temperature dependence of the cut-off frequency $f_0$ and Q of such a low-pass filter is explained. First, given Eq. (8), variation in frequency $f_0$ with respect to change in temperature T may be expressed as follows:

$$\frac{df_0}{dT} = \quad (16)$$

$$\frac{\partial f_0}{\partial R} \cdot \frac{dR}{dT} + \frac{\partial f_0}{\partial C} \cdot \frac{dC}{dT} + \frac{\partial f_0}{\partial a} \cdot \frac{da}{dT} + \frac{\partial f_0}{\partial b} \cdot \frac{db}{dT} =$$

$$\frac{1}{2\pi C} \sqrt{\frac{ab}{n}} \left( -\frac{1}{R^2} \right) \frac{dR}{dT} +$$

$$\frac{1}{2\pi R} \sqrt{\frac{ab}{n}} \left( -\frac{1}{C^2} \right) \frac{dC}{dT} +$$

$$\frac{1}{2} \cdot \frac{1}{\sqrt{a}} \cdot \frac{1}{2\pi RC} \sqrt{\frac{b}{n}} \frac{da}{dT} +$$

$$\frac{1}{2} \frac{1}{\sqrt{b}} \frac{1}{2\pi RC} \sqrt{\frac{a}{n}} \frac{db}{dT} =$$

$$-f_0 \frac{1}{R} \frac{dR}{dT} - f_0 \frac{1}{C} \frac{dC}{dT} + \frac{f_0}{2a} \frac{da}{dT} + \frac{f_0}{2b} \frac{db}{dT}$$

Thus, the following equation holds true:

$$\frac{1}{f_0} \frac{df_0}{dT} = - \quad (17)$$

$$\left( \frac{1}{R} \frac{dR}{dT} + \frac{1}{C} \frac{dC}{dT} \right) + \frac{1}{2} \left( \frac{1}{a} \frac{da}{dT} + \frac{1}{b} \frac{db}{dT} \right).$$

Then, if the temperature coefficients of the current amplification factors a and b are equal to the temperature coefficient of resistance R and there is no variation in capacitor C, then:

$$\frac{1}{a} \frac{da}{dT} = \frac{1}{b} \frac{db}{dT} = \frac{1}{R} \frac{dR}{dT} \quad (18)$$

$$\frac{1}{C} \frac{dC}{dT} = 0 \quad (19)$$

Thus, the following relationship results:

$$\frac{1}{f_0} \frac{df_0}{dT} = 0 \qquad (20)$$

Accordingly, there is no temperature dependence of the cut-off frequency $f_0$.

Furthermore, given Eq. (10), variation in Q relative to variation in temperature T is represented as follows:

$$\frac{dQ}{dT} = \frac{\partial Q}{\partial a} \frac{da}{dT} + \frac{\partial Q}{\partial b} \frac{db}{dT} \qquad (21)$$

$$= \frac{1}{2} \frac{1}{\sqrt{a}} \frac{\sqrt{nb}}{b} \frac{da}{dT} - \frac{1}{2} \frac{1}{\sqrt{b}} \frac{\sqrt{na}}{b} \frac{db}{dT}$$

$$= \frac{1}{2} Q \frac{1}{a} \frac{da}{dT} - \frac{1}{2} Q \frac{1}{b} \frac{db}{dT}$$

Thus, the following equation holds true:

$$\frac{1}{Q} \frac{dQ}{dT} = \frac{1}{2} \left( \frac{1}{a} \frac{da}{dT} - \frac{1}{b} \frac{db}{dT} \right) \qquad (22)$$

In Eq. (22), if the temperature coefficients of the current amplification factors a and b are equal, then there is no temperature dependence of value Q.

Figure 7:
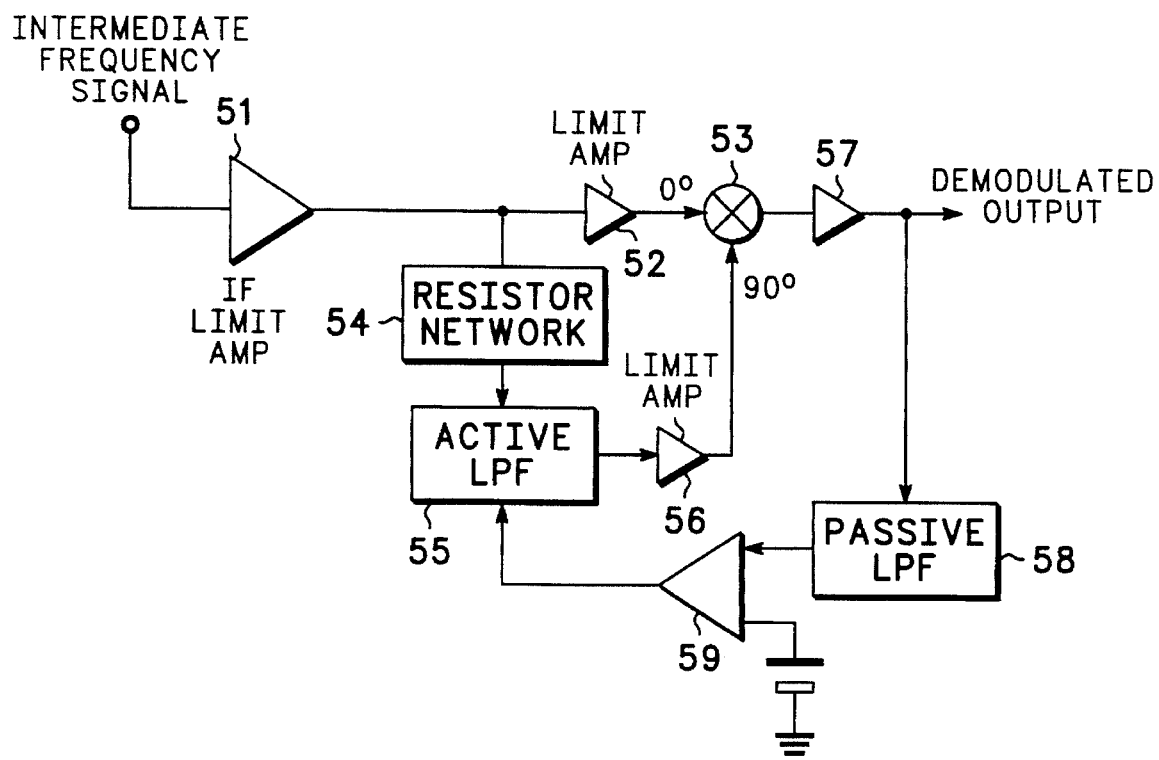
FIG. 7 is a block diagram depicting a FM demodulator circuit employing the low-pass filter according to the present invention.
Figure 8:
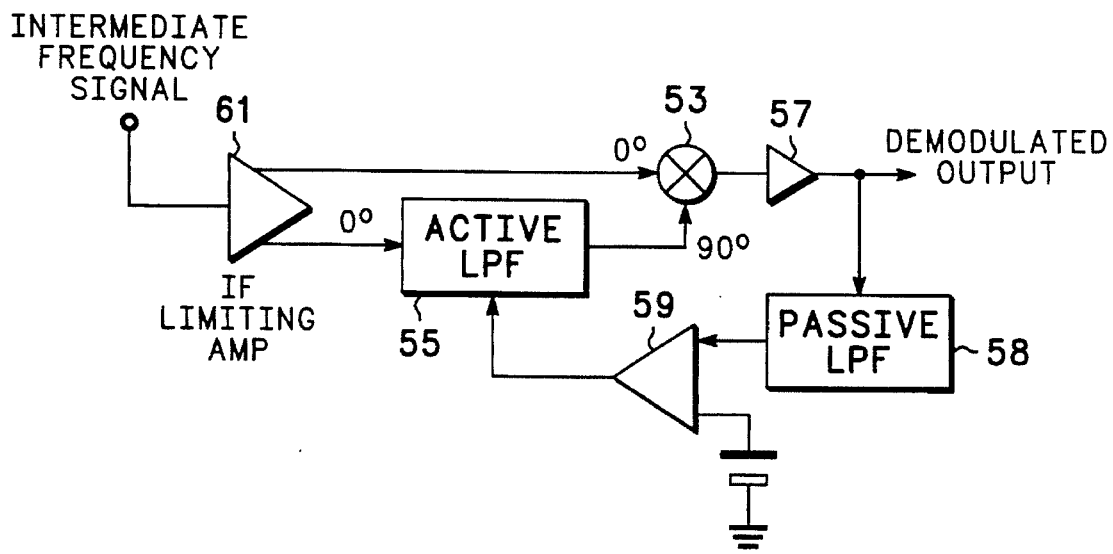
FIG. 8 is a block diagram depicting another FM demodulator circuit employing the low-pass filter according to the present invention.

FIGS. 7 and 8 each depict a FM demodulator circuit employing a low-pass filter according to the present invention. With the FM demodulator circuit of FIG. 7, the intermediate frequency signal is amplified by an IF limiter amplifier 51. The IF signal is an RF (radio frequency) signal converted by a mixer (not shown), and subsequently passed through a band-pass filter (not shown). The IF signal outputted from the IF limiter amplifier 51 is an output of, say, 0.6 Vpp, and supplied as a 0° IF signal via the limiter amplifier 51 to a phase difference detector 53. Furthermore, this IF signal is attenuated by a resistor network 54 and the attenuated IF signal is supplied to a low-pass filter 55 according to the present invention. The low-pass filter 55 outputs the supplied IF signal as a signal having a 90° phase difference near the intermediate frequency. The resulting 90° IF signal is supplied via a limiter amplifier 56 to the phase difference detector 53, so that a phase difference, dF, of each 0° and 90° IF signals is detected. The phase difference detector 53 outputs via a buffer 57 an AC voltage $dV_0$ corresponding to the phase difference dF, which produces a demodulation output. Furthermore, according to the demodulation output from this buffer 57, an average voltage is provided by a passive low-pass filter 58. Now it is assumed that a conversion factor, from the detection of the phase difference until an average voltage is obtained, is k1. Note that the cut-off frequency fc of the low-pass filter 58 is sufficiently lower than $2f_0$. The average voltage and reference voltage (a voltage outputted when the phase is 90°) are compared by an error amplifier 59 which employs a transconductance amplifier, and the current corresponding to the resulting difference is amplified and fed back as a frequency control signal for the low-pass filter 55. Now, let us assume that the conversion factor until it is fed back from the average voltage is k2. Then, the low-pass filter 55 can be varied so that the frequency with a phase difference of 90° is equal to the intermediate frequency, without changing Q of the circuit. Also assume that the conversion factor of the low-pass filter 55 is k3. Then, if there is a relationship between these conversion factors such that k1>k2·K3, feedback operation is eventually available where it is stable at the intermediate frequency.

With the FM demodulator circuit of FIG. 8, an IF limiter amplifier 61, different from the IF limiter amplifier 51 of the circuit of FIG. 7, is provided in the input stage, which generates amplified outputs at two different levels. Thus, the resistor network 54 and limiter amplifiers 52 and 56 of the circuit of FIG. 7 are not provided. The IF limiter amplifier 61 supplies an output of, say, 0.24 Vpp to the phase difference detector 53, and supplies the output of 40 mVpp to the low-pass filter 55. The rest of the arrangement and operation are similar to those of the FM demodulator circuit of FIG. 7.

In each of the above embodiments, an active low-pass filter having differential inputs and differential outputs has been described, although it is apparent that the present invention may be applied to an active low-pass filter having a single input and a single output with reference to ground.

Thus, with the active low-pass filter of the present invention, a current resulting from an input signal outputted from a first impedance element is amplified by a first current amplifier, and the resulting output current is converted by a first converting means to a voltage, which is supplied via a second impedance element to a second current amplifier; the output current of the second current amplifier is converted by a second converting means to a voltage and outputted as a filter output, while the current corresponding to the output voltage of the second converting means is negatively fed back into the inputs of the first and second current amplifiers; furthermore, at least the current amplification factor of the first current amplifier is made controllable. Thus, the current amplification factor of the first current amplifier can be varied to vary the cut-off frequency arbitrarily. As a result, an active low-pass filter suitable as a 90° phase shifter circuit can be obtained without incorporating external components when formed as an IC.

We claim:

1. An active low-pass filter, comprising:
   a first impedance element for accepting an input signal;
   a first current amplifier for amplifying a current outputted from said first impedance element received at an input thereof;
   a first converting means for converting a output current of said first current amplifier to a voltage to output it via a second impedance means therein;
   a second current amplifier for amplifying a current derived through the output voltage of said first converting means received at an input thereof;
   a second converting means for converting an output current of said second current amplifier to a voltage to output it as a filter output;
   a negative feedback means for negatively feeding back an current corresponding to the output voltage of said second converting means into the inputs of said first and second current amplifiers; and
   a control means for varying the current amplification factor of said first current amplifier.

2. An active low-pass filter according to claim 1, wherein said control means varies the current amplification factor of said first current amplifier and also the current amplification factor of said second current amplifier.

3. An active low-pass filter according to claim 2, wherein said control means includes a variable current source, said control means varying the current amplification factor of each of said first and second current amplifiers in accordance with the output current of said variable current source.

4. An active low-pass filter according to claim 1, wherein said input signal is accepted at a differential input, and said filter output is provided at a differential output.

* * * * *